(12) United States Patent
Xue et al.

(10) Patent No.: US 9,270,234 B2
(45) Date of Patent: Feb. 23, 2016

(54) SYSTEM AND METHOD FOR OPERATING A POWER AMPLIFIER AND A LOAD MODULATION NETWORK

(71) Applicant: City University of Hong Kong, Kowloon (HK)

(72) Inventors: Quan Xue, Kowloon (HK); Shichang Chen, Kowloon (HK)

(73) Assignee: City University of Hong Kong, Hong Kong (HK)

(*) Notice: Subject to any disclaimer, the term of this patent is extended or adjusted under 35 U.S.C. 154(b) by 169 days.

(21) Appl. No.: 13/973,409

(22) Filed: Aug. 22, 2013

(65) Prior Publication Data

US 2014/0062603 A1 Mar. 6, 2014

Related U.S. Application Data

(60) Provisional application No. 61/692,907, filed on Aug. 24, 2012.

(51) Int. Cl.
*H03F 3/68* (2006.01)
*H03F 1/56* (2006.01)
*H03F 1/02* (2006.01)
*H03F 3/60* (2006.01)
*H03F 3/24* (2006.01)

(52) U.S. Cl.
CPC ............... *H03F 1/56* (2013.01); *H03F 1/0288* (2013.01); *H03F 3/24* (2013.01); *H03F 3/60* (2013.01); *H03F 3/68* (2013.01)

(58) Field of Classification Search
CPC ..................................................... H03F 1/0288
USPC .................... 330/34, 53, 84, 124 R, 286, 295
See application file for complete search history.

(56) References Cited

U.S. PATENT DOCUMENTS

2012/0223775 A1* 9/2012 Kim et al. ................. 330/124 R

* cited by examiner

*Primary Examiner* — Khanh V Nguyen
*Assistant Examiner* — Khiem Nguyen
(74) *Attorney, Agent, or Firm* — Renner Kenner Greive Bobak Taylor & Weber (57) ABSTRACT

A system and method for operating a power amplifier comprising the steps of determining a first impedance generated by a first amplifier component of the power amplifier, determining a second impedance generated by a second amplifier component of the power amplifier, and, adjusting the first impedance or the second impedance to an optimal impedance condition by altering a current ratio of a current delivered by the first amplifier component and a current delivered by the second amplifier component.

14 Claims, 9 Drawing Sheets

SYSTEM AND METHOD FOR OPERATING A POWER AMPLIFIER AND A LOAD MODULATION NETWORK

CROSS-REFERENCE TO RELATED APPLICATIONS

This application claims the benefit of U.S. Provisional Application No. 61/692,907, filed Aug. 24, 2012.

TECHNICAL FIELD

This invention relations to a system and method for operating a power amplifier and particularly, although not exclusively, to a load modulation network and usage thereof for a Doherty power amplifier.

BACKGROUND

In modern telecommunications, there is a common use of amplifiers to amplify signals which are transmitted over a communication network. With telecommunication being more and more accessible and common, there is a need to improve the quality and efficiency of the amplifiers which are used to amplify signals for telecommunication purposes.

As modulated signals which are common for wireless communications such as CDMA-2000, WCDMA and LTE generally have a high peak-to-average power ratio (PAPR) which in turn has demanded a different type of amplifiers to operate efficiently.

To operate with these types of modulated signals, the power amplifiers have to be very linear in order to prevent in-band distortion and out-of-band emission. As such, one option to achieve this is to operate the amplifier at a large back-off region far from saturation. However, this inevitably leads to low efficiency as well as a higher than normal power consumption of the amplifier. Various other options are available to improve the efficiency in operating the power amplifiers, but whilst these have solved one problem, they have, by their presence, introduced other inefficiency issues on operating the amplifiers.

SUMMARY OF THE INVENTION

In accordance with one aspect of the invention, there is provided a load modulation network (LMN) for a power amplifier, wherein the load modulation network is arranged to operate with transmission line characteristic impedance generated by a current ratio of each of a plurality of amplifying modules of the power amplifier.

By taking the current ratio between two sub-amplifiers into consideration, characteristic impedances in LMN can be devised to overcome imperfect load modulation exists in conventional design. Accordingly, efficiency and output power can be enhanced by this. Following comprehensive theoretical analysis to describe the underlying principles and design procedures, extensive simulation and experimental measurement was carried out to confirm it. Considerable performance improvement was demonstrated in terms of output power and efficiencies.

In accordance with a first aspect of the present invention there is provided a method for operating a power amplifier comprising the steps of:
  determining a first impedance generated by a first amplifier component of the power amplifier;
  determining a second impedance generated by a second amplifier component of the power amplifier; and,
  adjusting the first impedance or the second impedance to an optimal impedance condition by altering a current ratio of a current delivered by the first amplifier component and a current delivered by the second amplifier component.

In an embodiment of the first aspect, the optimal impedance condition is for a high power operation region of the first amplifier component.

In an embodiment of the first aspect, the optimal impedance condition is for a high power operation region of the second amplifier component.

In an embodiment of the first aspect, the optimal impedance condition is reached when the first impedance is substantially matched to an impedance of an output load.

In an embodiment of the first aspect, the second impedance is substantially matched to the impedance of the output load.

In an embodiment of the first aspect, the power amplifier includes one or more impedance transformers associated with the first amplifier component arranged to adjust the first impedance.

In an embodiment of the first aspect, the one or more impedance transformers associated with the first amplifier component is connected with the first amplifier.

In an embodiment of the first aspect, the power amplifier includes one or more impedance transformers associated with the second amplifier component arranged to adjust the second impedance.

In an embodiment of the first aspect, the one or more impedance transformers associated with the second amplifier component is connected with an output load.

In an embodiment of the first aspect, the first and second impedance are adjusted by adjusting one or more transformer impedances of the one or more impedance transformers associated with the first or second amplifier component.

In an embodiment of the first aspect, the one or more transformer impedances are represented by an impedance/current ratio relationship whereby altering of the current ratio adjusts the one or more transformer impedance.

In an embodiment of the first aspect, the current ratio is defined by the current delivered by the second amplifier component divided by the current delivered by the first amplifier component for a high power region.

In an embodiment of the first aspect, the current ratio is altered by altering the current delivered by the first amplifier component and/or altering the current delivered by the second amplifier component.

In an embodiment of the first aspect, the impedance/current ratio relationship is defined as $Z_T = \delta Z_0$ for the impedance transformer associated with the first amplifier component, where:
$Z_T$ is the impedance for the impedance transformer associated with the first amplifier component,
$\delta$ is the current ratio defined by the current delivered by the second amplifier component divided by the current delivered by the first amplifier component; and
$Z_0$ is the impedance of the output load.

In an embodiment of the first aspect, the impedance/current ratio relationship is defined as $Z_{T'} = \delta/\sqrt{1+\delta^2} \cdot Z_0$ for the impedance transformer associated with the second amplifier component, where:
$Z_{T'}$ is the impedance for the impedance transformer associated with the second amplifier component,
$\delta$ is the current ratio defined by the current delivered by the second amplifier component divided by the current delivered by the first amplifier component and
$Z_0$ is the impedance of the output load.

In an embodiment of the first aspect, the power amplifier is a Doherty amplifier.

In an embodiment of the first aspect, the first amplifier component is a carrier amplifier and the second amplifier component is a peaking amplifier.

In an embodiment of the first aspect, the power amplifier further includes a first offset line and a first output matching network disposed between the first amplifier component and the associated impedance transformer, the first offset line and the first output matching network being arranged to provide optimum impedance to the first amplifier component.

In an embodiment of the first aspect, the power amplifier further includes a second offset line and a second output matching network disposed between the second amplifier component and the associated impedance transformer, the second offset line and the second output matching networking being arranged to provide optimum impedance to the second amplifier component.

In an embodiment of the first aspect, the first and second offset lines and matching networks are arranged to substantially match the impedance of the first and second amplifiers to the first and second impedance.

In accordance with a second aspect of the invention, there is provided a system for operating a power amplifier comprising:
 a first sensor arranged to determine a first impedance generated by a first amplifier component of the power amplifier;
 a second sensor arranged to determining a second impedance generated by a second amplifier component of the power amplifier; and,
 a control module arranged to adjust the first impedance or the second impedance to an optimal impedance condition by altering a current ratio of a current delivered by the first amplifier component and a current delivered by the second amplifier component.

In an embodiment of the second aspect, the optimal impedance condition is for a lower power operation region of the power amplifier.

In an embodiment of the second aspect, the optimal impedance condition is for a high power operation region of the power amplifier.

In an embodiment of the second aspect, the optimal impedance condition is reached when the first impedance is substantially matched to an impedance of an output load.

In an embodiment of the second aspect, the second impedance is substantially matched to the impedance of the output load.

In an embodiment of the second aspect, the power amplifier includes one or more impedance transformers associated with the first amplifier component arranged to adjust the impedance the first impedance.

In an embodiment of the second aspect, the one or more impedance transformers associated with the first amplifier component is connected with the first amplifier.

In an embodiment of the second aspect, the power amplifier includes one or more impedance transformers associated with the second amplifier component arranged to adjust the second impedance.

In an embodiment of the second aspect, the one or more impedance transformers associated with the second amplifier component is connected with an output load.

In an embodiment of the second aspect, the first and second impedance are adjusted by adjusting one or more transformer impedances of the one or more impedance transformers associated with the first or second amplifier component.

In an embodiment of the second aspect, the one or more transformer impedances are represented by an impedance/current ratio relationship where by altering of the current ratio adjusts the one or more transformer impedance.

In an embodiment of the second aspect, the current ratio is defined by the current delivered by the second amplifier component divided by the current delivered by the first amplifier component for a high power region.

In an embodiment of the second aspect, the current ratio is altered by altering the current delivered by the first amplifier component and/or altering the current delivered by the second amplifier component.

In an embodiment of the second aspect, the impedance/current ratio relationship is defined as $Z_T = \delta Z_0$ for the impedance transformer associated with the first amplifier component, where:
 $Z_T$ is the impedance for the impedance transformer associated with the first amplifier component,
 $\delta$ is the current ratio defined by the current delivered by the second amplifier component divided by the current delivered by the first amplifier component; and
 $Z_0$ is the impedance of the output load.

In an embodiment of the second aspect, the impedance/current ratio relationship is defined as $Z_{T'} = \delta/\sqrt{(1+\delta^2)} \cdot Z_0$ for the impedance transformer associated with the second amplifier component, where:
 $Z_{T'}$ is the impedance for the impedance transformer associated with the second amplifier component,
 $\delta$ is the current ratio defined by the current delivered by the second amplifier component divided by the current delivered by the first amplifier component and
 $Z_0$ is the impedance of the output load.

In an embodiment of the second aspect, the power amplifier is a Doherty amplifier.

In an embodiment of the second aspect, the first amplifier component is a carrier amplifier and the second amplifier component is a peaking amplifier.

In an embodiment of the second aspect, the power amplifier further includes a first offset line and a first output matching network disposed between the first amplifier component and the associated impedance transformer, the first offset line and the first output matching network being arranged to provide optimum impedance to the first power amplifier component.

In an embodiment of the second aspect, the power amplifier further includes a second offset line and a second output matching network disposed between the second amplifier component and the associated impedance transformer, the second offset line and the second output matching network being arranged to provide optimum impedance to the second amplifier component.

In an embodiment of the second aspect, the first and second offset lines and matching networks are arranged to substantially match the impedance of the first and second amplifiers to the first and second impedance.

In accordance with a third aspect of the present invention, there is provided a load modulation network for a Doherty amplifier comprising:
 a first impedance transformer associated with a carrier amplifier having a first impedance;
 a second impedance transformer associated with a peaking amplifier having a second impedance; wherein,
 the first impedance transformer and the second impedance transformer is arranged to alter an impedance of the carrier amplifier and the peaking amplifier respectively by affecting a selectively adjustment of a current delivered by the carrier amplifier and a current delivered by the peaking amplifier through the use of a first and second impedance/current ratio relationship arranged to derive the first and second impedance based on a current ratio of the current delivered by the carrier amplifier and the current delivered by the peaking amplifier.

In an embodiment of the third aspect, the load modulation network is arranged to optimize the Doherty amplifier by substantially matching the impedance of the carrier amplifier with an impedance of an output load.

In an embodiment of the third aspect, the load modulation network is arranged to optimize the Doherty amplifier by substantially matching the impedance of the peaking amplifier with the impedance of the output load.

In an embodiment of the third aspect, the first impedance/current ratio relationship is defined by $Z_T = \delta Z_0$, where:

$Z_T$ is the impedance for the impedance transformer associated with the first amplifier component, $\delta$ is the current ratio defined by the current delivered by the second amplifier component divided by the current delivered by the first amplifier component; and $Z_0$ is the impedance of the output load.

In an embodiment of the third aspect, the second impedance/current ration relationship is defined by $Z_{T'} = \delta/\sqrt{(1+\delta^2)} \cdot Z_0$, where:

$Z_{T'}$ is the impedance for the impedance transformer associated with the second amplifier component, $\delta$ is the current ratio defined by the current delivered by the second amplifier component divided by the current delivered by the first amplifier component; and $Z_0$ is the impedance of the output load.

In an embodiment of the third aspect, the load modulation further comprises an offset line and output matching network arranged to further optimize the impedance of the carrier amplifier and the impedance of the peaking amplifier.

In an embodiment of the third aspect, the offset line and output matching network is disposed between the first and second impedance transformer and its associated carrier or peaking amplifier.

In accordance with a fourth aspect of the present invention, there is provided a method for optimizing a Doherty amplifier comprising the steps of:

adjusting the impedance of a carrier amplifier and a peaking amplifier to substantially match an impedance of an output load, wherein the impedance of the carrier amplifier and the peaking amplifier is adjusted by controlling a ratio defined by a peaking current and a carrier current.

In an embodiment of the fourth aspect, the ratio is applied to an impedance/current ratio relationship to alter the impedance of the carrier amplifier and the peaking amplifier.

In an embodiment of the fourth aspect, the method further comprises an output matching network arranged to further optimize the impedance of the carrier amplifier and the impedance of the peaking amplifier.

In an embodiment of the fourth aspect, the impedance/current ratio relationship is defined by $Z_T = \delta Z_0$ and $Z_{T'} = \delta/\sqrt{(1+\delta^2)} \cdot Z_0$ where:

$Z_T$ is the impedance for the impedance transformer associated with the first amplifier component, $Z_{T'}$ is the impedance for the impedance transformer associated with the second amplifier component $\delta$ is the current ratio defined by the current delivered by the second amplifier component divided by the current delivered by the first amplifier component; and $Z_0$ is the impedance of the output load.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

In some embodiments, an example Doherty power amplifier (DPA) may comprise two sub-amplifiers; one is the carrier amplifier whilst the other is the peaking amplifier.

According to the trials and research of the inventors, the operation of the DPA can be roughly divided into two regions, high-power and low-power, respectively. When the input power is low, the peaking power amplifier (PA) is in the off-state, and only the carrier power amplifier (PA) operates and it determines the DPA performance. When the input power is high, the two amplifiers contribute to the overall output simultaneously.

In an ideal case, it is assumed that the peaking PA turns on at half of the maximum input voltage and has the same maximum current swing at saturation as the carrier PA. Nevertheless, if identical devices are adopted for the two amplifiers, the maximum fundamental current generated by the peaking cell will be smaller due to its lower biasing.

Consequently, the load impedances cannot be fully modulated to optimum values and efficiency may degrade using classic load modulation network (LMN) which is built on the assumption of identical currents generated by the two PAs. In view of this degradation in efficiency, a number of approaches are possible to achieve identical currents. These include uneven power division, different transistor peripheries and bias adaption. However, each method has its own disadvantages such as power loss, gain degradation or requiring extra control circuit. In some examples, a load modulated structure may also include the peaking PA being arranged to deliver less current than the carrier PA, but it requires dual inputs for the two sub-amplifiers, thus increasing the complexity and costs for the use of the amplifier.

In one embodiment, there is provided a LMN for a Doherty amplifier. In this embodiment, the transmission line characteristic impedances are devised according to the current ratio between the two amplifiers, rather than using standardized values in other cases. With this approach described below with reference to one embodiment of the invention, the modulated load deviation and the efficiency degradation caused by the cell current unbalance can be mitigated. Simulation and measurement results demonstrate considerable efficiency improvement and output power enhancement for the design comparing with the conventional one. Particularly, this is the first work that focuses directly on the output interface of a DPA, while all the previous works emphasized on optimizing the input interface or choosing devices with differing sizes.

Figure 1:
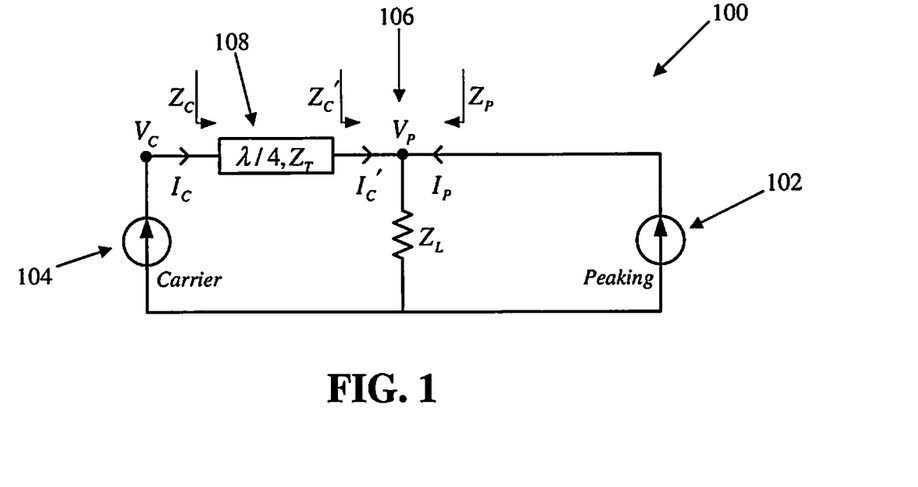
FIG. 1 is a wiring diagram of an example Doherty power amplifier.

With reference to FIG. 1, it is shown an example of a simplified operation diagram of the load modulation network of DPA 100. If each transistor 102, 104 is considered as an ideal current source, the impedance seen at the junction point 106 can be expressed as $$Z'_C = Z_L \left( \frac{I'_C + I_P}{I'_C} \right) = Z_L \left( 1 + \frac{I_P}{I'_C} \right) \quad (1)$$

$$Z_P = Z_L \left( \frac{I'_C + I_P}{I_P} \right) = Z_L \left( 1 + \frac{I'_C}{I_P} \right) \quad (2)$$

The $\lambda/4$ line $Z_T$ 108 after the carrier amplifier 104 acts as an impedance transformer. The relationship between the voltages and currents at the two sides of this transmission line can be written as follows:

$$V_P \cdot I'_C = V_C \cdot I_C \quad (3)$$

$$\frac{V_C}{I_C} \cdot \frac{V_P}{I'_C} = Z_T^2 \quad (4)$$

By rearranging the above two equations, it gives $$V_P = I_C \cdot Z_T \quad (5)$$

$$I'_C = \frac{V_C}{Z_T} \quad (6)$$

substituting (5) and (6) into (1) and (2), $$Z'_C = Z_L \left( 1 + \frac{I_P \cdot Z_T}{V_C} \right) \quad (7)$$

$$Z_P = Z_L \left( 1 + \frac{V_C}{Z_T \cdot I_P} \right) \quad (8)$$

Moreover $$Z_C = \frac{Z_T^2}{Z'_C} = \frac{Z_T^2}{Z_L \left( 1 + \frac{I_P \cdot Z_T}{V_C} \right)} \quad (9)$$

Noted that $V_C = I_C \cdot Z_C$, we can have $$Z_C = \frac{Z_T^2}{Z_L} \left( 1 - \frac{I_P}{I_C} \cdot \frac{Z_L}{Z_T} \right) \quad (10)$$

$$Z_P = \frac{V_P}{I_P} = \frac{I_C}{I_P} \cdot Z_T \quad (11)$$

The above two equations illustrate that the effective load impedances seen by the current sources are a function of $Z_T$ and $Z_L$ as well as the current ratio between the two cells.

In general cases, standardized characteristic impedances for the quarter-wavelength line ($Z_T = Z_0$) and load ($Z_L = Z_0/2$) are adopted. With further assumption of identical currents at saturation, the effective impedances at different power levels can be easily derived using equation (10) and (11).

When input is low, the peaking PA is completely shut off ($I_P = 0$), the impedances are given by $$Z_{C,Low} = \frac{Z_T^2}{Z_L} = 2Z_0 \quad (12)$$

$$Z_{P,Low} = \infty \quad (13)$$

When input is high, two amplifiers operate simultaneously, the impedances are given by $$Z_{C,High} = \frac{Z_T^2}{Z_L} \left( 1 - \frac{Z_L}{Z_T} \right) = Z_0 \quad (14)$$

$$Z_{P,High} = Z_0 \quad (15)$$

In one example, the load of carrier PA is modulated from $2Z_0$ to $Z_0$, while that of the peaking PA is modulated from $\infty$ to $Z_0$ with the increase of the input power.

It is described below an analysis conducted by the inventors that the unbalanced current profile between the carrier and peaking cells and its impact on the DPA efficiency.

For a transistor working as an ideal voltage control current source with harmonic short-circuits provided at output, the drain current components can be expressed in terms of the conduction angle and maximum drain current ($I_{max}$) as $$I_{C,dc} = \frac{I_{max}}{2\pi} \cdot \frac{2\sin(\phi_C/2) - \phi_C \cdot \cos(\phi_C/2)}{1 - \cos(\phi_C/2)} \quad (16)$$

$$I_{P,dc} = \frac{I_{max}}{2\pi} \cdot \frac{2\sin(\phi_P/2) - \phi_P \cdot \cos(\phi_P/2)}{1 - \cos(\phi_P/2)}$$

$$I_{C,1} = \frac{I_{max}}{2\pi} \cdot \frac{\phi_C - \sin\phi_C}{1 - \cos(\phi_C/2)} \quad (17)$$

$$I_{P,1} = \frac{I_{max}}{2\pi} \cdot \frac{\phi_P - \sin\phi_P}{1 - \cos(\phi_P/2)}$$

Where $I_{C,1}$, $I_{P,1}$, $I_{C,dc}$, $I_{P,dc}$, $\Phi_C$, and $\Phi_P$ represent the fundamental currents, DC currents and conduction angles of the carrier and peaking cells, respectively. $I_{max}$ is the maximum drain current the transistor can support.

In some examples, bias conditions for the carrier amplifier and peaking amplifier are set to near pinch-off ($\Phi_C \approx 180°$) and below pinch-off ($\Phi_P < 180°$), respectively. It can be seen from (17) that the fundamental current of the peaking cell is smaller than that of the carrier cell due to its lower biasing. For further use, a new parameter $\delta = I_{P,1}/I_{C,1}$ ($\delta < 1$) is defined as the current ratio.

Figure 2:
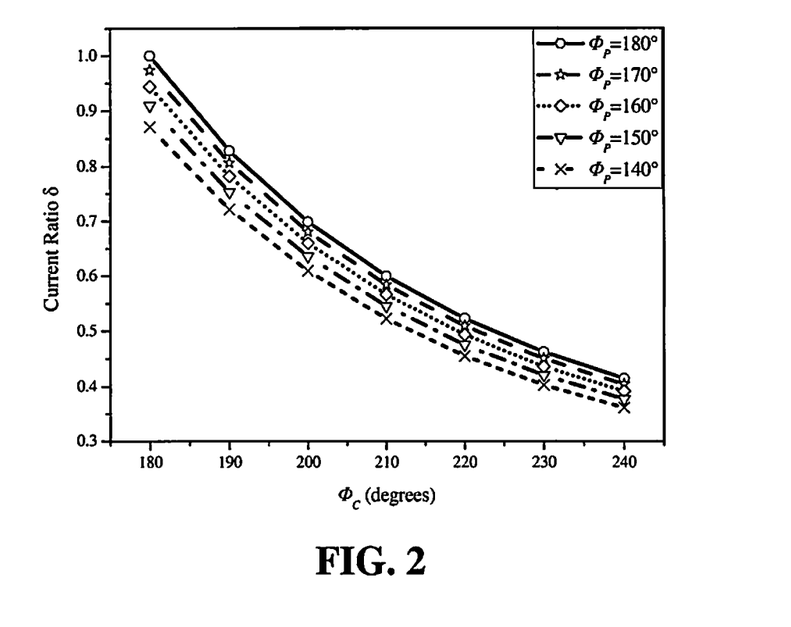
FIG. 2 is a diagram illustrating the current ratio $\delta$ under different conduction angles for the two amplifiers based on the same transistor.
Figure 3:
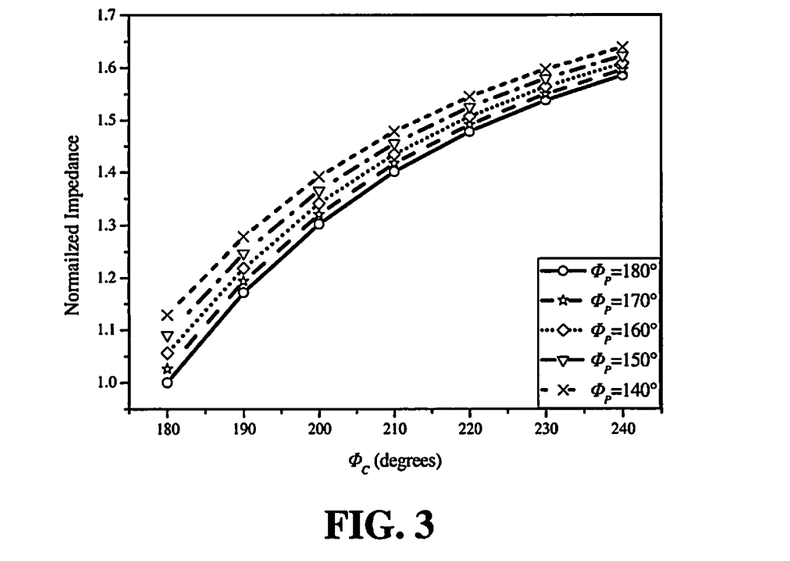
FIG. 3 is a diagram illustrating the normalized load impedance (with reference to $z_0$) for carrier power amplifier (PA) using a classic load modulation network at high power.
Figure 4:
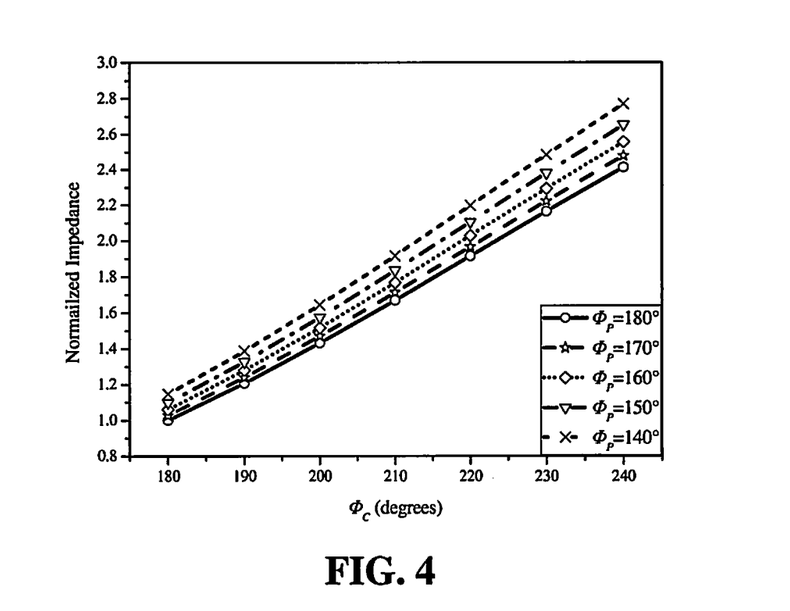
FIG. 4 is a diagram illustrating the normalized load impedance (with reference to $z_0$) for peaking PA using a classic load modulation network at high power.

As shown in FIG. 2, the $\delta$ value as a function of different conduction angles for the two sub-amplifiers. It is evident that $\delta$ can significantly differ from 1.0 assumed by the ideal case. For instance, when $\Phi_C = 240°$ and $\Phi_P = 140°$, $\delta$ drops to as low as 0.36. If standardized values $Z_T = Z_0$ and $Z_L = Z_0/2$ are still applied, modulated load impedances at maximum power as calculated in (10) and (11) will deviate dramatically from $Z_0$. FIG. 3 and FIG. 4 depict the normalized (with reference to $Z_0$) effective load impedances at high-power region for the carrier and peaking amplifiers as a function of different conduction angles. It is evident that in most cases, these values are deviated from unity. Under these circumstances, efficiency reduction may happen because of impedance mismatch. Moreover, as the load impedances are modulated to larger values for both sub-amplifiers as shown in FIG. 3 and FIG. 4, they get saturated earlier in the high-power region, leading to the reduction of output power. Consequently, at the same back-off power point, the efficiency is degraded when compared with the ideal case.

The above analysis may indicate that the impact of this inherent current unbalance problem should be addressed for DPA performance enhancement. To resolve this problem, efforts were focused on making the currents in both amplifiers equal. However, such an option will cause new problems, such as lower gain and mismatch of transistors.

In some instances, the current difference between the two amplifiers can be kept unchanged but made use of by a new load modulation network. As mentioned below and with reference to FIG. 8, there is shown a load modulation network for a Doherty amplifier comprising:
 a first impedance transformer associated with the carrier amplifier having a first impedance;
 a second impedance transformer associated with the output load to let the peaking amplifier having a second impedance; wherein,
the first impedance transformer and the second impedance transformer is arranged to alter an impedance of the carrier amplifier and the peaking amplifier respectively by using a predetermined current ratio applied to a first and second impedance/current ration relationship to derive the first and second impedance.

Figure 8:
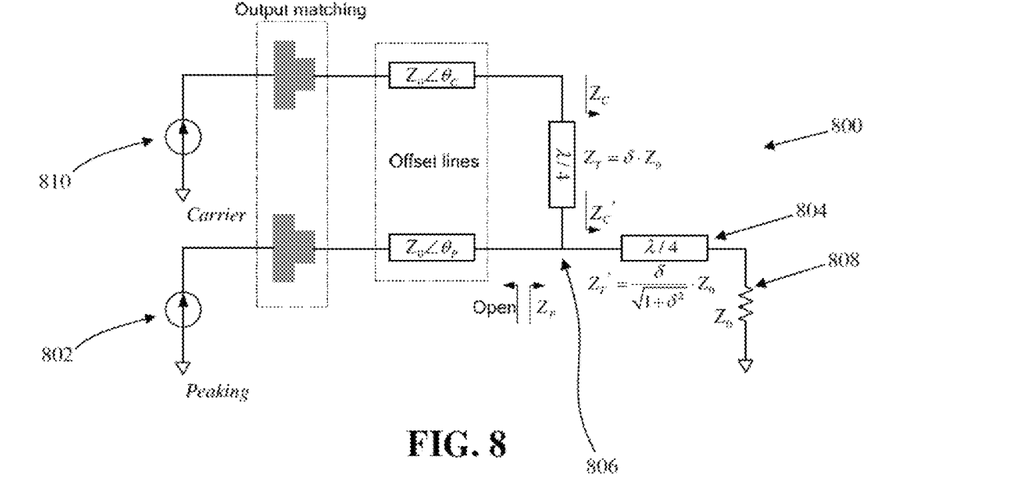
FIG. 8 is a simplified wiring diagram of a Doherty Power Amplifier (DPA) with a load modulation network in accordance with one embodiment of the present invention.

As shown in this embodiment, it is possible to retrieve the optimal load impedance by taking the current ratio $\delta$ into consideration. By rewriting (10) and (11), device load impedances at high power can be derived as follows:

$$Z_{C,High} = \frac{Z_T^2}{Z_L}\left(1 - \frac{I_{P,1}}{I_{C,1}} \cdot \frac{Z_L}{Z_T}\right) = \frac{Z_T^2}{Z_L}\left(1 - \delta \cdot \frac{Z_L}{Z_T}\right) \quad (18)$$

$$Z_{P,High} = \frac{I_{C,1}}{I_{P,1}} \cdot Z_T = \frac{Z_T}{\delta} \quad (19)$$

Letting $Z_{C,high} = Z_{P,high} = Z_0$, it is obtained that $$Z_T = \delta \cdot Z_0 \quad (20)$$

$$Z_L = \frac{\delta^2}{1+\delta^2} \cdot Z_0 \quad (21)$$

Substituting (20), (21) into (10), the load impedance seen by the carrier PA at low-power region ($I_P = 0$) becomes $$Z_{C,low} = \frac{Z_T^2}{Z_L} = (1 + \delta^2) \cdot Z_0 \quad (22)$$

Figure 5:
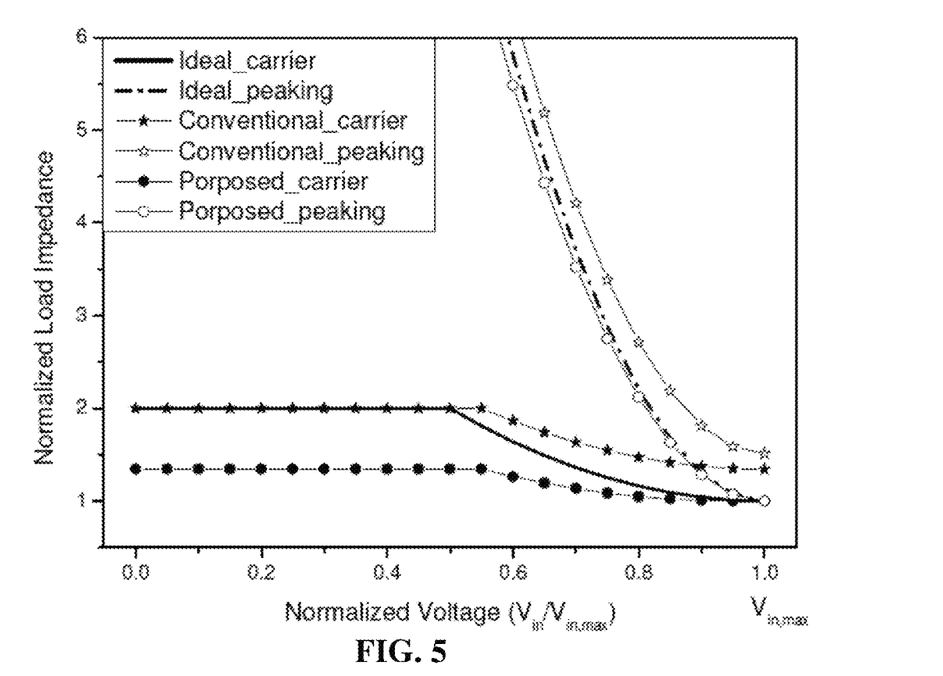
FIG. 5 is a diagram illustrating the load impedance variations to the normalized input voltage.

The above equations shows that by adopting the new characteristic impedance values, the resulting load modulation is from $(1+\delta^2) \cdot Z_0$ to $Z_0$ for the carrier cell, and from $\infty$ to $Z_0$ for the peaking cell. In FIG. 5, it is shown a comparison of the load variation traces against the normalized input voltage for three different cases: ideal Doherty Power amplifier as described in the DPA based on conventional LMN and the DPA based on the proposed topology. Two conduction angles $\Phi_C = 220°$ and $\Phi_P = 160°$ are chosen for illustrative purpose, $\delta$ value is read from FIG. 2 to be 0.65. It shows that the conventional design has drastically differing modulation trace from the ideal case. On the other hand, the proposed design exhibits much closer to ideal impedance modulation trend at high-power region for both sub-amplifiers. Although the load for carrier PA at low-power region differs with the ideal case, it can be easily solved by adding a matching network and an offset line.

It is important to note that the optimum matched impedances are usually complex values because of transistor parasitics. Nevertheless, the above-mentioned LMNs can provide only pure resistive values, so output matching network with a proper length of transmission line must be inserted between the device and LMN to provide the optimum impedance.

Suppose, in one example that the optimal impedance for carrier amplifier at saturation is $Z_{o,sat} = R_{o,sat} + j \cdot X_{o,sat}$, where the reactance $X_{o,sat}$ is for compensating the parasitic reactance of the transistor at the operation frequency. The fundamental voltage swing $V_{1,sat} = R_{o,sat} \cdot I_{C,1} = V_{dc}$, $V_{dc}$ denotes the DC supply voltage.

When the input power is below the critical value as $v_{in} = \gamma \cdot V_{in,amx}$ ($\gamma < 1$), the peaking amplifier is in the off-state. If the optimal impedance for carrier PA is $Z_{o,bkf} = R_{o,bkf} + j \cdot X_{o,bkf}$ at this point, the fundamental voltage swing is $V_{1,bkf} = \gamma \cdot I_{C,1} \cdot R_{o,bkf}$. To achieve the same voltage swing for the two states, $R_{o,bkf} = R_{o,sat}/\gamma > R_{o,sat}$. The output matching network and offset line combination is exploited to match distinct loads at different power levels.

Figure 6:
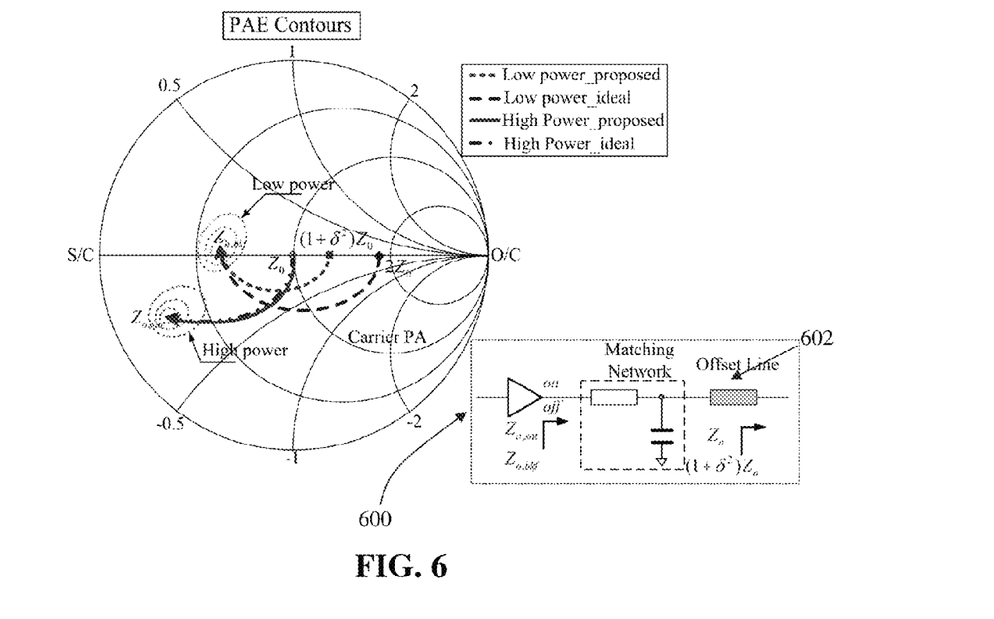
FIG. 6 is a simplified schematic diagram for carrier PA in the proposed design, and the matching traces for different cases on Smith Chart.

With reference to FIG. 6, there is shown a diagram of the carrier amplifier 600 and compares the matching traces for the proposed and ideal designs on the Smith Chart. It can be shown that the two cases can achieve the same performance in the high-power region because they have identical initial impedance $Z_0$. More importantly, similar performances can also be expected at low power, as long as the matched loads are locating on the same efficiency contour, even though the starting points are different.

Figure 7:
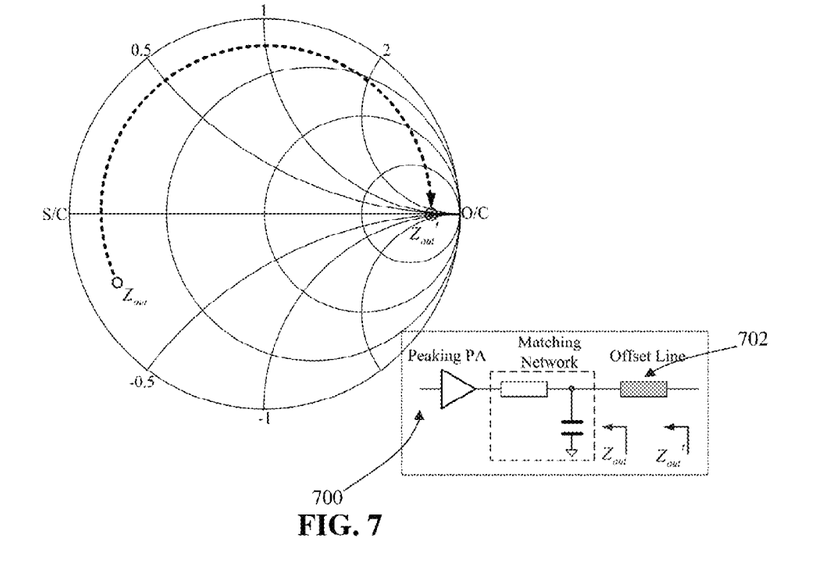
FIG. 7 is a diagram illustrating the design process of offset line for the peaking amplifier.

With reference to FIG. 7, the peaking amplifier's 700 output impedance in the off-state is usually low and capacitive. To prevent reverse current leakage, a section of offset line may be included to transfer the output impedance seen at the junction point to near open circuit. As shown in FIG. 7, the output impedance (marked by $Z_{out}$) is rotated to a high-resistive value on Smith Chart (mark by $Z_{out}'$) by inserting a proper length of transmission line.

It is worth emphasizing that both offset lines 602, 702 have characteristic impedance of $Z_0$, and their existence keeps the matching intact at high-power region. On the contrary, characteristic impedances for the conventional design cannot be simply set to $Z_0$ due to deviated load as shown in FIG. 5, which leads to impedance mismatch in the high-power region.

FIG. 8 also shows a schematic diagram of an embodiment of a system for operating a power amplifier comprising:
- a first sensor arranged to determine a first impedance generated by a first amplifier component of the power amplifier;
- a second sensor arranged to determining a second impedance generated by a second amplifier component of the power amplifier; and,
- a control module arranged to adjust the first impedance or the second impedance to an optimal impedance condition by altering a current ratio of a current delivered by the first amplifier component and a current delivered by the second amplifier component.

In this embodiment, the present invention is implemented with a Doherty amplifier 800. As it is shown in this embodiment, another transmission line may be inserted before the peaking PA 802 to make the phases coherent of the two paths. The input part is eliminated for the sake of simplicity. The $\lambda/4$ line $Z_T'$ 804 is inserted between the junction point 806 and load 808 for impedance transformation, its characteristic impedance may therefore be calculated as $$Z_T' = \sqrt{Z_0 \cdot Z_L} = \frac{\delta}{\sqrt{1+\delta^2}} \cdot Z_0 \qquad (23)$$

In one example embodiment, the Doherty amplifier 800 can be optimized during operation so as to enhance the efficiency of the amplifier 800. This optimization process may include the steps of adjusting the impedance generated by the carrier PA 810 and the peaking PA 802 so as to reach an optimal impedance condition. This optimal impedance condition may include a condition where the impedance generated by each of the amplifiers would allow the operation of the amplifier 800 to be most effective.

In one embodiment, the optimal impedance condition is reached by adjusting the impedance generated by each of the two amplifiers 802, 810. In one example, the impedance generated by each of the two amplifiers 802, 810 may be transformed by the load modulation network associated with the two amplifiers 802, 810. In the embodiments shown in FIG. 8, the impedance transformers are shown as $\lambda/4$ line which has its own transformer impedance of $Z_T$ and $Z_T'$. As these transformer impedances are determined, the impedance generated by each of the two amplifiers 802, 810 are in turn generated accordingly.

In a preferred example embodiment, the generation to the transformer impedances is made by taking into consideration a current ratio which is in turned applied to an impedance/current ratio relationship which represents the impedance of the transformers with respect to a current ratio. The relationship and the current ration can be represented, in this embodiment as follows:

This current ratio, denoted as $\delta$ is defined, in one embodiment, as the current delivered by the peaking amplifier ($I_P$) 802 divided by the carrier amplifier ($I_C$) 810. It can also be mathematically written as $\delta = I_P/I_C$, The impedance/current ratio relationships may, in this embodiment, be represented by:

$$Z_T = \delta Z_0$$

for the impedance transformer associated with the carrier amplifier component 810,
where:
$Z_T$ is the impedance for the impedance transformer associated with the first amplifier component,
$\delta$ is the current ratio defined by the current delivered by the second amplifier component divided by the current delivered by the first amplifier component; and
$Z_0$ is the impedance of the load; and $$Z_T' = \delta/\sqrt{1+\delta^2} \cdot Z_0$$

for the impedance transformer associated with the output load 808,
where:
$Z_T'$ is the impedance for the impedance transformer associated with the output load,
$\delta$ is the current ratio defined by the current delivered by the second amplifier component divided by the current delivered by the first amplifier component and
$Z_0$ is the impedance of the load.

By these impedance/current ratio relationships, once the current ratio is determined, the optimal impedance for the two amplifier component 802, 810 can also be reached by optimizing the matching networks and offset lines. In a high power operation region, this condition may be reached when the impedances of the carrier amplifier and the peaking amplifier are matched.

Results of a Simulation of the an Example Embodiment of the DPA of FIG. 8

In the description above, theoretical analysis of the current unbalance problem and corresponding solution has been described. For the validation of this new design, ADS simulation was conducted based on the model for a medium-power pHEMT ATF-50189. The carrier PA was biased at deep class-AB mode, while the peaking PA was biased at class-C mode. Once determining the bias conditions, we could get the corresponding current ratio, the simulated result was $\delta = 0.70$. As a consequence, the characteristic impedances $Z_T$ and $Z_T'$ for the proposed topology were calculated to be 35Ω and 28.7Ω. Load-pull simulations were performed to find the optimal impedances at different power levels, which were then used to design matching networks and offset lines. For comparison purpose, simulation of the design exploiting conventional approach was also performed. The corresponding LMN characteristic impedance values are 50Ω and 35.3Ω, respectively.

One can emphasize that although the proposed methodology focused on optimizing characteristic impedance of transmission lines, it is also applicable for designs built on lumped elements whose values can be inferred directly from transmission line characteristics.

Figure 9:
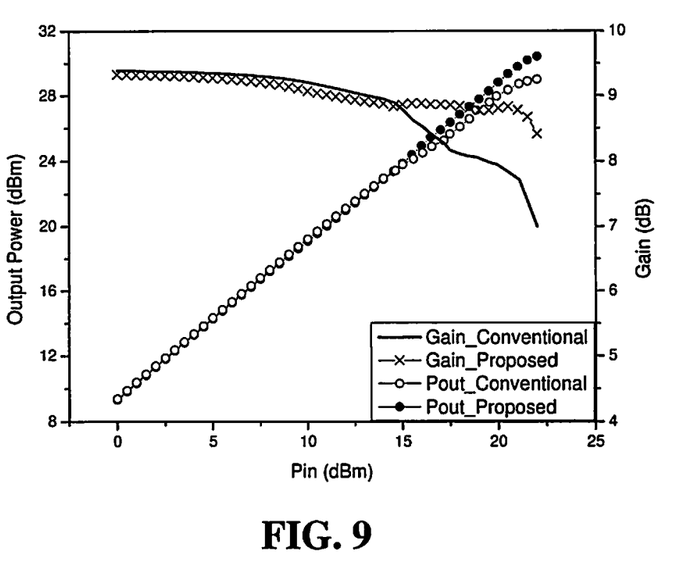
FIG. 9 is a diagram illustrating the simulated gain and output power as a function of input power of an embodiment of a DPA in accordance with one embodiment of the invention and a conventional DPA.

With reference to FIG. 9, there is shown a comparison of the simulated output power and gain of the two designs as a function of input power. It can be seen that the performances are very close at low-power region because the two carrier amplifiers are matched to similar impedances. At high-power region, output power of the proposed design was enhanced as expected due to the improved load modulation operation.

Figure 10:
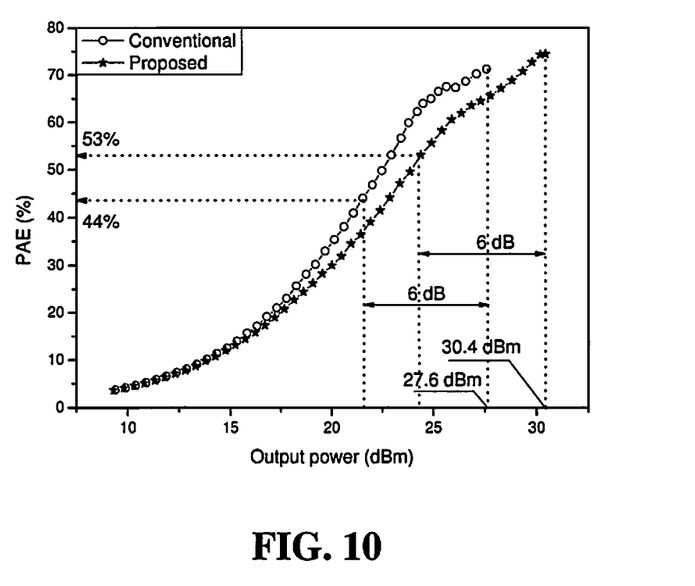
FIG. 10 is a diagram illustrating the simulated PAE value as a function of output power of an embodiment of a DPA in accordance with one embodiment of the invention and a conventional DPA.

In FIG. 10, power-added efficiency (PAE) as a function of output power is depicted. It is shown that the PAE value at 6-dB output back-off (OBO) is increased from 44% to 53%, accounting for 9% enhancement using the proposed strategy. Moreover, the output 1-dB compression point (OP1 dB) is also considerably enhanced, increasing from 27.6 dBm to 30.4 dBm. As expected, the recovery of optimal load impedances for both sub-amplifiers generates higher output power in the proposed design. The power back-off range can be enlarged accordingly, which leads to increased overall efficiency for signals with large PAPR.

Experimental Verification

A. Efficiency and Output Power Enhancements

In order to demonstrate the merits of an embodiment of the present invention in terms of output power and efficiency, two DPA prototypes corresponding to the proposed and conventional designs are implemented to operate at 2.14 GHz on a Rogers substrate with $\epsilon_r$=2.33 and a thickness of 31 mil. The same transistors are used as in simulation. The gate bias of the carrier and peaking PAs are adjusted to be 0.30V and –0.25V respectively, ensuring a small gain fluctuation for DPA. Drain supply voltages are fixed to 4.5V for all devices.

Figure 11:
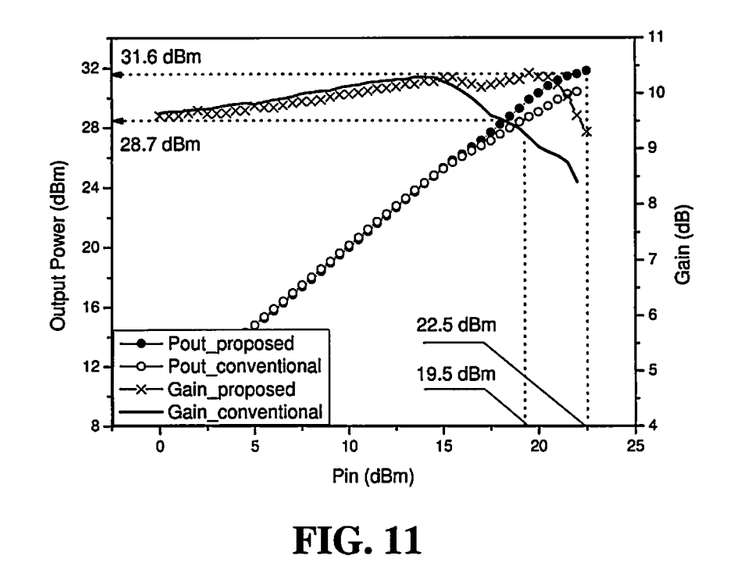
FIG. 11 is a diagram illustrating the measured power gain and output power as a function of input power of the proposed and conventional DPAs under CW signal.

With reference to FIG. 11, it is illustrated that the measured gain and output power as a function of input power using continuous wave (CW) signal. As can be noted, the input 1-dB compression point (IP1 dB) increases from 19.5 dBm for the conventional design to 22.5 dBm for the proposed one. Regarding the OP1 dB, the values are 28.7 dBm and 31.6 dBm respectively, accounting for a 2.9 dBm enhancement.

Figure 12:
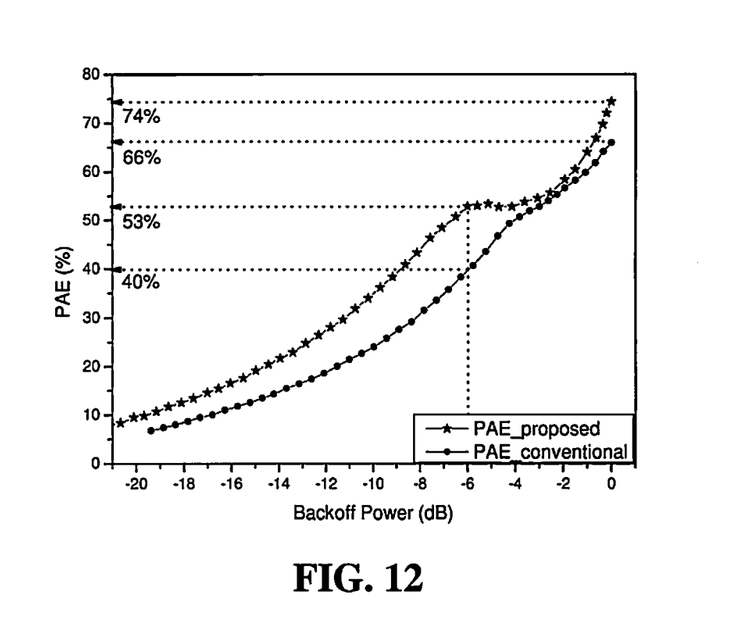
FIG. 12 is a diagram illustrating the measured PAE versus back-off power of the proposed and conventional DPAs under CW signal.

PAE characteristic to the back-off power (OP1 dB was set as saturation power, corresponding to 0 dB on the X-axis) is illustrated in FIG. 12. The values at peak power and 6-dB OBO point are 74% and 53% for the proposed design. In contrast with 66% and 40% for the conventional design, 8% and 13% improvements are achieved, respectively.

Figure 13:
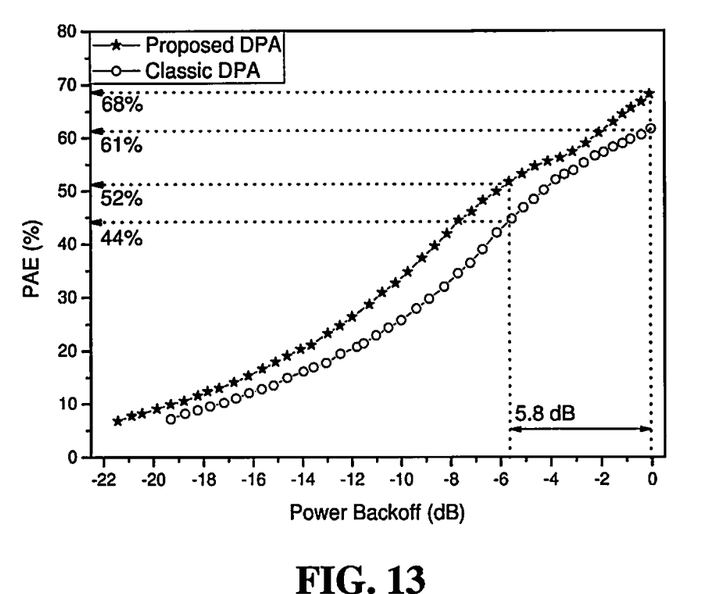
FIG. 13 is a diagram illustrating the measured PAE versus back-off power of the proposed and conventional DPAs under WCDMA excitation.

For a thorough comparison, modulated signal is also used to perform a further investigation. FIG. 13 depicts the measured PAE performance versus back-off power using a 2.14 GHz downlink WCDMA, with 5.8-dB PAPR. It is evident that similar characteristics are obtained as CW signal, PAE values at peak power and average power (5.8-dB OBO) are boosted by 7% and 8% respectively, after adopting the new design methodology.

Figure 14:
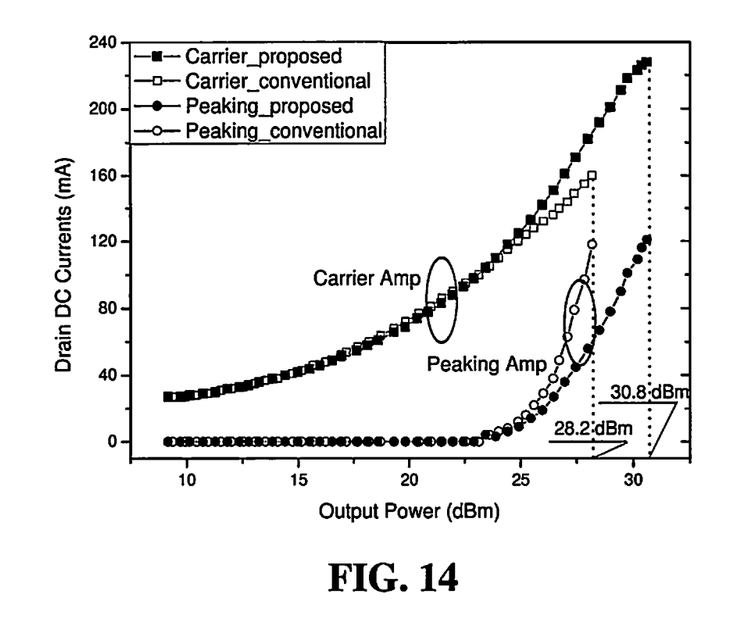
FIG. 14 is a diagram illustrating the measured drain DC currents of the proposed and conventional DPAs under WCDMA excitation.
Figure 15:
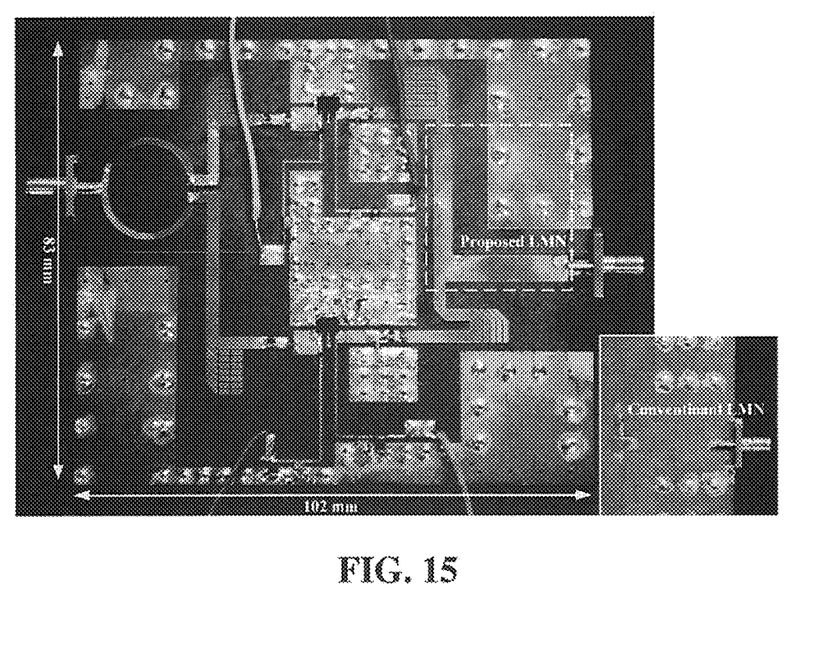
FIG. 15 is a photograph of a fabricated circuit of the DPA with an embodiment of a load modulation network of FIG. 8.

FIG. 14 shows the DC current profile of the implemented DPA prototypes as a function of output power under WCDMA signal. The two fabricated circuits exhibit similar characteristics at low-power region because of similar matched loads for the carrier PAs. The carrier current is lower for the conventional implementation at high-power region because its gain compression cannot be compensated well due to inadequate load modulation. In other words, it saturates much harder than the counterpart in the proposed DPA. On the other hand, the peaking current for the conventional design is much higher. This attributes a lot to the efficiency degradation, which is also caused by inadequate load modulation. FIG. 15 presents the picture of the proposed DPA. The LMN of the conventional DPA is appended for comparison.

B. Linearity Performance

Figure 16:
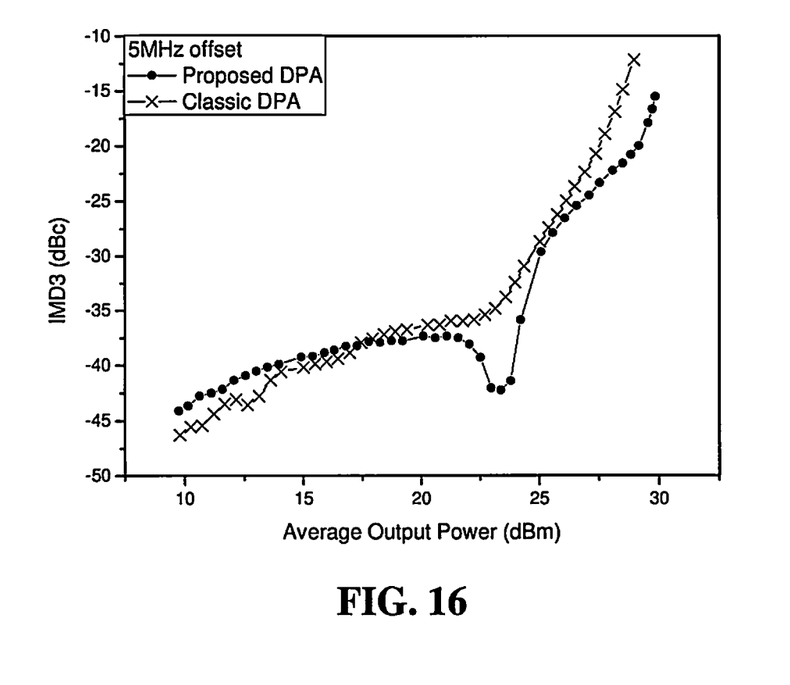
FIG. 16 is a diagram illustrating the measured IMD3 characteristics of an embodiment of a DPA in accordance with one embodiment of the invention and a conventional DPA under two-tone signal; and, FIG. 17 is a diagram illustrating the measured ACLR characteristic of an embodiment of a DPA in accordance with one embodiment of the invention and a conventional DPA under WCDMA excitation.

The linearity assessment is conducted by testing the third-order intermodulation distortion (IMD3) using a two-tone signal with 5-MHz spacing. As shown in FIG. 16, they exhibit similar linearity performance at low-power region, and it is slightly worse for the conventional design around peak power. Besides, it is interesting to note that an IMD3 "sweet spot" is shown in the proposed design near 23 dBm output power but not in the conventional design.

Figure 17:
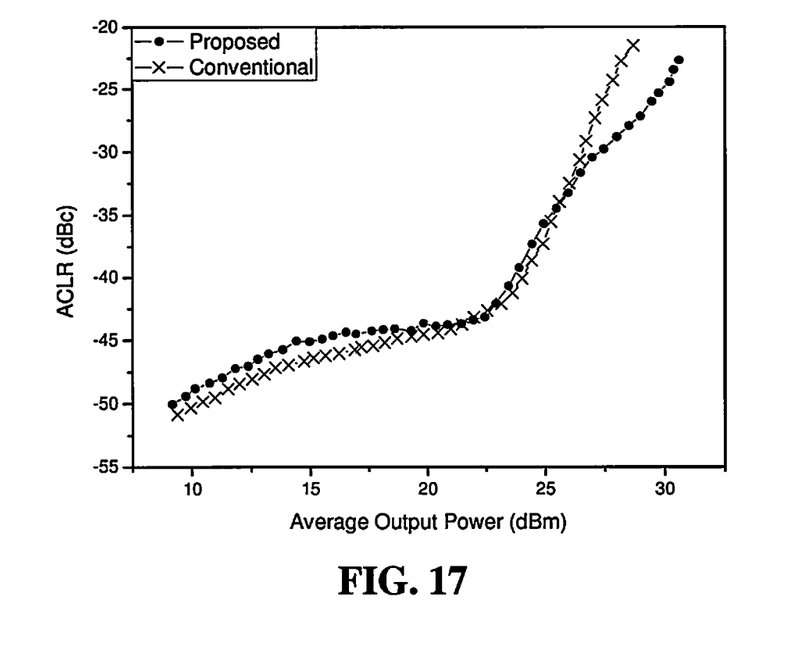

FIG. 17 shows the adjacent channel power ratio (ACLR) to the output power at 5 MHz offset. The two DPAs achieve very close linearity performance across wide power range, while it became slightly better for the proposed design near saturation.

This invention is advantageous in that some of the embodiments described are able to solve output power and efficiency reduction due to current unbalance directly from the output interface. The inherent different current driving abilities were utilized by an embodiment of a LMN. In addition, these embodiments are straightforward, effective and low-cost approach without any need for additional circuitry.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method for operating a power amplifier comprising the steps of:
   determining a first impedance generated by a first amplifier component of the power amplifier;
   determining a second impedance generated by a second amplifier component of the power amplifier; and,
   adjusting the first impedance or the second impedance to an optimal impedance condition by altering a current ratio of a current delivered by the first amplifier component and a current delivered by the second amplifier component;
   wherein the power amplifier includes a first impedance transformer associated with the first amplifier component arranged to adjust the first impedance, and a second impedance transformer associated with the second amplifier component arranged to adjust the second impedance;
   wherein the first and second impedances are adjusted by adjusting transformer impedances of the first impedance transformer and the second impedance transformers;
   wherein the transformer impedances are represented by an impedance/current ratio relationship whereby altering of the current ratio adjusts the transformer impedances; and
   wherein the current ratio is defined by a current delivered by the second amplifier component divided by a current delivered by the first amplifier component for a high power region.

2. The method in accordance with claim 1, wherein the optimal impedance condition is for a high power operation region of the first amplifier component.

3. The method in accordance with claim 1, wherein the optimal impedance condition is for a high power operation region of the second amplifier component.

4. The method in accordance with claim 3, wherein the optimal impedance condition is reached when the first impedance is substantially matched to an impedance of an output load.

5. The method in accordance with claim 4, wherein the optimal impedance condition is reached when the second impedance is also substantially matched to the impedance of the output load.

6. The method in accordance with claim 1, wherein the first impedance transformer associated with the first amplifier component is connected with the first amplifier.

7. The method in accordance with claim 1, wherein the second impedance transformer associated with the second amplifier component is connected with an output load.

8. The method in accordance with claim 1, wherein the current ratio is altered by altering the current delivered by the first amplifier component or the current delivered by the second amplifier component.

9. The method in accordance with claim 1, wherein the impedance/current ratio relationship is defined as $Z_T = \delta \cdot Z_0$ for the first impedance transformer associated with the first amplifier component, where:
  $Z_T$ is the impedance for the first impedance transformer,
  $\delta$ is the current ratio defined by the current delivered by the second amplifier component divided by the current delivered by the first amplifier component; and
  $Z_0$ is the impedance of the output load.

10. The method in accordance with claim 9, wherein the impedance/current ratio relationship is defined as $Z_T' = \delta / sqrt(1 + \delta^2) \cdot Z_0$ for the second impedance transformer associated with the second amplifier component, where:
  $Z_T'$ is the impedance for the second impedance transformer,
  $\delta$ is the current ratio defined by the current delivered by the second amplifier component divided by the current delivered by the first amplifier component and
  $Z_0$ is the impedance of the output load.

11. The method in accordance with claim 1, wherein the power amplifier is a Doherty amplifier.

12. The method in accordance with claim 11, wherein the first amplifier component is a carrier amplifier and the second amplifier component is a peaking amplifier.

13. The method in accordance with claim 1, wherein the power amplifier further includes a first offset line and a first output matching network disposed between the first amplifier component and the first impedance transformer, the first offset line and the first output matching network being arranged to provide optimum impedance to the first amplifier component.

14. The method in accordance with claim 13, wherein the power amplifier further includes a second offset line and a second output matching network disposed between the second amplifier component and the second impedance transformer, the second offset line and the second output matching networking being arranged to provide optimum impedance to the second amplifier component.

* * * * *